US009714986B2

(12) United States Patent
Otobe

(10) Patent No.: US 9,714,986 B2
(45) Date of Patent: Jul. 25, 2017

(54) RESOLVER WITH A WIRE OUTGOING PORTION AND TERMINAL PIN COVER

(71) Applicant: Minebea Co., Ltd., Kitasaku-gun, Nagano (JP)

(72) Inventor: Haruki Otobe, Fukuroi (JP)

(73) Assignee: MINEBEA CO., LTD., Kitasaku-gun (JP)

( * ) Notice: Subject to any disclaimer, the term of this patent is extended or adjusted under 35 U.S.C. 154(b) by 174 days.

(21) Appl. No.: 14/456,553

(22) Filed: Aug. 11, 2014

(65) Prior Publication Data

US 2015/0061652 A1 Mar. 5, 2015

(30) Foreign Application Priority Data

Aug. 27, 2013 (JP) ................................. 2013-175410

(51) Int. Cl.
*G01B 7/30* (2006.01)
*G01R 33/02* (2006.01)
*G01D 5/20* (2006.01)
(52) U.S. Cl.
CPC ........... *G01R 33/02* (2013.01); *G01D 5/2046* (2013.01)
(58) Field of Classification Search
CPC ........ H02K 1/246; G01P 3/488; F02P 7/0675; G01D 5/2046; G01B 7/30; G01R 33/02
See application file for complete search history.

(56) References Cited

U.S. PATENT DOCUMENTS

| 2004/0119350 A1* | 6/2004 | Miya | H02K 3/522 |
| | | | 310/71 |
| 2012/0262015 A1* | 10/2012 | Shin | G01D 5/2006 |
| | | | 310/71 |
| 2012/0262158 A1* | 10/2012 | Matsuura | G01D 5/2046 |
| | | | 324/207.17 |
| 2013/0049742 A1* | 2/2013 | Ochiai | H02K 24/00 |
| | | | 324/207.16 |

FOREIGN PATENT DOCUMENTS

| JP | 2008079470 A | * 4/2008 |
| JP | 2009-027841 A | 2/2009 |
| JP | 2011200007 A | * 10/2011 |
| JP | A-2011-232213 | 11/2011 |

OTHER PUBLICATIONS

English machine translation of the description of JP 2008079470, obtained from the EPO patent website (http://worldwide.espacenet.com/advancedSearch?locale=en_EP), obtained on Apr. 8, 2016.*
Nov. 21, 2016 Office Action issued in Japanese Patent Application No. 2013-175410.

\* cited by examiner

*Primary Examiner* — Jay Patidar
*Assistant Examiner* — David M. Schindler
(74) *Attorney, Agent, or Firm* — Oliff PLC

(57) ABSTRACT

A resolver has a stator includes a circular yoke, multiple salient poles radially projecting inward from the yoke, and winding wires wound around the salient poles via an insulator; a rotor disposed inside the stator; a wire outgoing portion arranged with plural terminal pins, the terminal pins being connected to end portions of the winding wires; and a terminal pin cover attached to the wire outgoing portion and covering the terminal pins. The terminal pin cover includes multiple spaces that individually contain one of the terminal pins. A filler is filled in each space, whereby the end portion (Continued)

of the winding wire electrically connected to the terminal pin is sealed in the filler.

7 Claims, 4 Drawing Sheets

RESOLVER WITH A WIRE OUTGOING PORTION AND TERMINAL PIN COVER

BACKGROUND OF THE INVENTION

Field of the Invention

The present invention relates to resolvers, and specifically relates to a structure of a terminal portion having terminal pins around which an end portion of a winding wire of a resolver is wound.

Description of Related Art

Resolvers are known as a means for detecting the rotation angle of a subject. For example, a resolver may be used as a sensor for detecting the rotation angle of an electric motor that is installed in electric cars, hybrid cars, etc. In this case, the resolver includes a rotor that is fixed to a rotating shaft of a motor and rotated therewith and a stator that is fixed to a housing and disposed outside the rotor. When the rotor rotates, the size of an air gap formed between the rotor and the stator changes, and a voltage corresponding to the change is induced in a measuring coil of the stator side, whereby measured output is generated. The measured output corresponds to the rotation angle of the rotor, and the rotation angle of the motor is measured.

A rotor of a resolver has a structure in which multiple circular rotor cores having plural projections radially projecting outward are layered. A stator is disposed outside the rotor. The stator has a structure in which plural stator cores having plural salient poles radially projecting inward from a circular yoke are axially layered. Two insulators are attached to the layered stator cores from both axial sides thereof. An excitation winding wire and an output winding wire are wound around the salient poles via the insulators. The output winding wire is composed of a winding wire outputting sine signals and a winding wire outputting cosine signals that have a phase differing by 90 degrees relative to the sine signals. The end portions of the excitation winding wire and the output winding wire are wound around terminal pins and are electrically connected thereto. The terminal pins are embedded in a terminal support that is integrally formed with the insulator. As such a resolver, a disclosure of, for example, Japanese Unexamined Patent Application Laid-open No. 2011-232213 is known.

In the resolver disclosed in the above document, a connecting means for connecting an end portion of a winding wire to a terminal pin is not specified. In general, connecting of an end portion of a winding wire to a terminal pin is performed such that the end portion of the winding wire is wound around the terminal pin, then the wound portion is fixed by solder or welding.

When the end portion of the winding wire as shown in the above document is wound around the terminal pin, then the wound portion is welded by a welding method such as TIG welding, etc., and is electrically connected to the terminal pin, a portion of a copper wire in the welded portion of the end portion of the winding wire is exposed. If the resolver in the above condition is used in an environment in which water drops adhere or corrosive elements such as sulfides included in an engine oil or an automatic transmission fluid exist, the exposed portion of copper wire is corroded, conduction trouble caused by breaking or corrosion of wire may occur.

In view of such circumstances, it is an object of the present invention to provide a technique in which an end portion of a winding wire is fixed to a terminal pin by welding, and the like, and corrosion of the end portion of the wound wire can be prevented even if the resolver is used in an environment having corrosive elements.

SUMMARY OF THE INVENTION

The present invention provides a resolver including: a stator including a circular yoke, plural salient poles radially projecting inward from the yoke, and winding wires wound around the salient poles via an insulator; a rotor disposed inside the stator; a wire outgoing portion arranged with plural terminal pins, the terminal pins being connected to end portions of the winding wires; and a terminal pin cover attached to the wire outgoing portion and covering the terminal pins; wherein the terminal pin cover includes plural spaces which individually contains the terminal pins respectively, a filler is filled in each space, whereby the end portion of the winding wire electrically connected to the terminal pin is sealed in the filler.

According to the present invention, plural spaces corresponding to each terminal pin are formed in the terminal pin cover, and a portion of the terminal pin to which the end portion of the winding wire is connected is contained in each space. The filler is filled in inside of the terminal pin cover, whereby the portion in which the end portion of the winding wire is connected to the terminal pin is sealed by the filler in each space. Therefore, corrosion of the end portion of the winding wire, that is, corrosion of the portion that is welded and exposes a copper wire, can be prevented even if the resolver is used in an environment having corrosive elements.

In the present invention, an engaging portion for engaging with the wire outgoing portion is integrally formed at both sides of the terminal pin cover. According to this feature, the terminal pin cover mechanically engages with the wire outgoing portion, and the terminal pin cover can easily be attached to the stator and fixed to the stator in stable condition.

According to the structure of the resolver of the present invention, since the opening of the terminal pin cover is separated so that each terminal pin is individually contained, whereby the end portion of the winding wire, which is welded to the terminal pin, is stably sealed in the filler. Therefore, corrosion of the end portion of the winding wire can be prevented even if the resolver is used in an environment having corrosive elements.

PREFERRED EMBODIMENTS OF THE INVENTION

Figure 1:
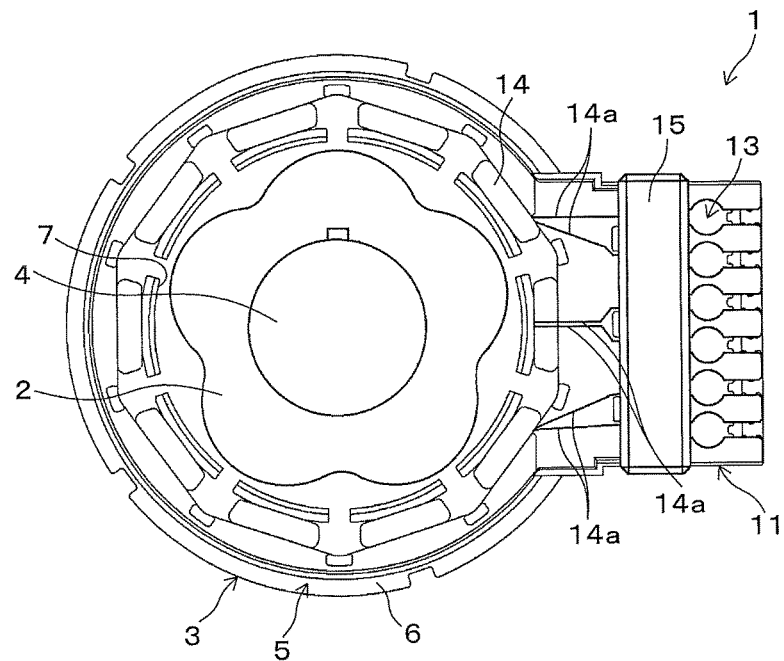
FIG. 1 is a plane view showing an embodiment of a resolver.
Figure 2:
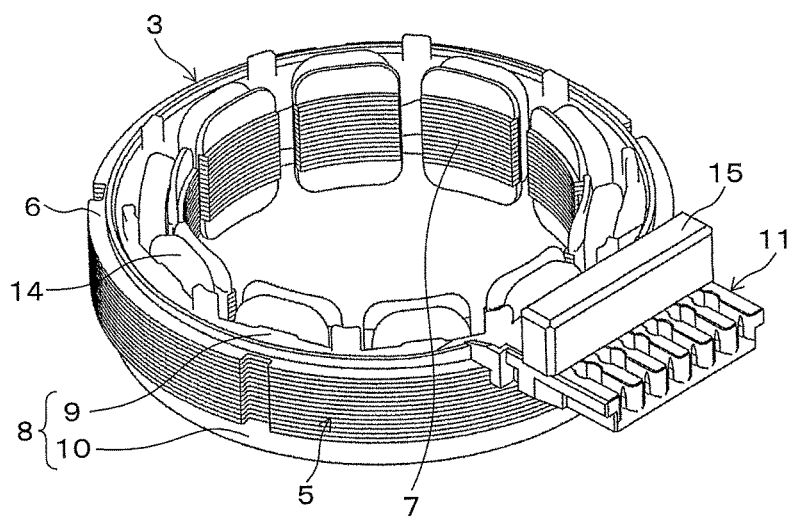
FIG. 2 is a perspective view of a stator of the resolver shown in FIG. 1.
Figure 3:
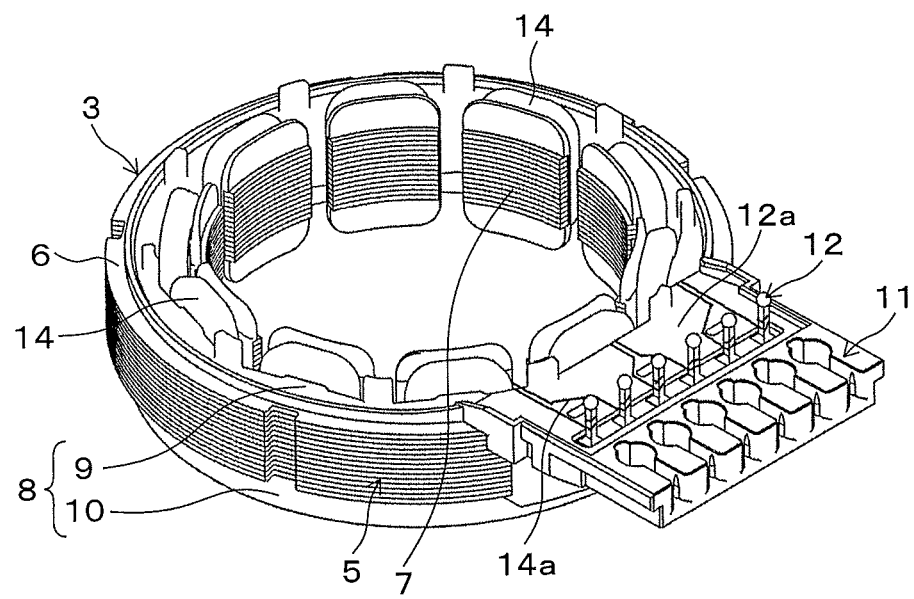
FIG. 3 is a perspective view of the stator showing a condition in which the terminal pin cover is removed.

An embodiment of a resolver according to the invention will be explained with reference to the drawings. FIG. 1 shows a resolver according to the embodiment, FIG. 2 is a perspective view of a stator of the resolver shown in FIG. 1, and FIG. 3 is a perspective view of the stator shown in FIG. 2, showing a condition in which a terminal pin cover is removed.

FIG. 1 shows a resolver 1. The resolver 1 in the embodiment is a VR (variable reluctance) type resolver that is used for detecting rotation angle of a rotating shaft of a motor. The resolver 1 has a rotor 2 and a stator 3. The stator 3 has a stator core assembly 5, an insulator 8 (see FIG. 2) which is attached to the stator core assembly 5, and winding wires 14 that are wound to the stator core assembly 5 via the insulator 8.

The rotor 2 is fixed to a rotating shaft 4 of a motor (not shown). The rotor 2 is formed by layering plural non-circular rotor cores having multiple projections radially projecting outward. The rotor core is formed by press punching a plate made of a magnetic steel plate. The rotor 2 is obtained by axially layering plural rotor cores and caulking them.

The stator 3 is disposed outside the rotor 2. The stator core assembly 5 composing the stator 3 is formed by axially layering plural circular stator cores having plural salient poles radially projecting inward from a circular yoke 6. The stator core is formed by press punching a plate made of a magnetic steel plate. The stator core assembly 5 is obtained by axially layering plural stator cores and caulking them.

An insulator 8 formed of an insulating resin is attached to both axial end portions of the stator core assembly 5. The insulator 8 is formed by injection molding and is composed of a first insulator 9 that is attached to the stator core assembly 5 from an axial end thereof and a second insulator 10 that is attached to the stator core assembly 5 from another axial end thereof.

The first insulator 9 includes a wire outgoing portion 11 radially projecting outward. The wire outgoing portion 11 is integrally formed with the first insulator 9 by injection molding. The wire outgoing portion 11 includes a terminal pin embedding surface 12a (see FIG. 3), in which plural terminal pins 12 made of a conductive material are embedded in a standing condition in the axial direction. The terminal pin 12 is provided such that an end portion 14a of a winding wire 14 mentioned below is wound therearound and is connected thereto, and six terminal pins 12 are arranged in a line. Numeral 13 donates a terminal, to which a lead wire (not shown) for receiving signals from outside and outputting signals to the outside is connected. The terminal 13 is integrally formed with the terminal pin 12 so as to form an L-shape, in which an end thereof is the terminal pin 12 and the other end is the terminal 13.

The winding wire 14 is composed of a copper wire with an insulating coating. The winding wire 14 is wound around the portion extending toward the center axis in each salient pole 7 via the insulator 8, thereby forming a coil. The winding wire 14 is composed of an excitation winding wire and an output winding wire. The excitation winding wire is provided with excitation electric current from outside. The output winding wire is composed of an output winding wire outputting sine signals according to the rotation of the rotor 2 and an output winding wire outputting cosine signals that have phases differing by 90 degrees from the sine signals. Each end portion 14a of the excitation winding wire, the output winding wire outputting sine signals, and the output winding wire outputting cosine signals, is connected to the terminal pin 12 provided to the wire outgoing portion 11. Specifically, each end portion 14a of the winding wires 14 is wound around the terminal pin 12, and the wound portion is weld by TIG welding, whereby the end portion 14a and the terminal pin 12 are joined by welding and are electrically and physically connected.

As a result of the TIG welding to the wound portion, the copper wire of the end portion 14a of the winding wire 14 is exposed at the portion wound around the terminal pin 12. In order to protect the portion in which the copper wire is exposed in the end portion 14a of the winding wire 14, in the embodiment, as shown in FIGS. 1 and 2, a terminal pin cover 15 is attached to the wire outgoing portion 11 while covering the terminal pins 12 (see FIG. 3).

Figure 4:
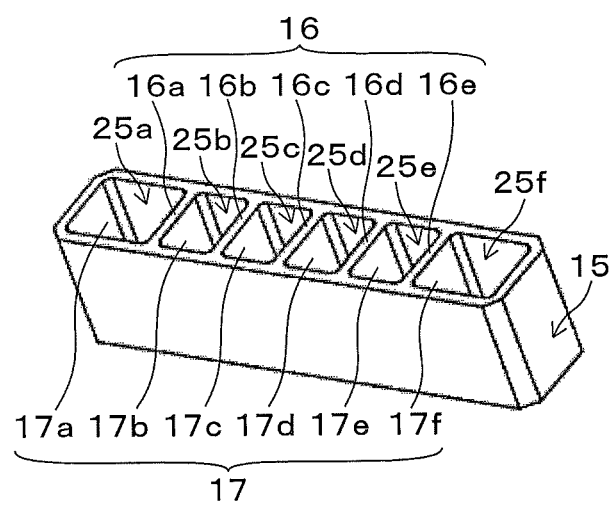
FIG. 4 is a perspective view of the terminal pin cover shown in FIG. 2.

The structure that protects the portion in which the copper wire is exposed in the end portion 14a of the winding wire 14 is explained hereinafter. FIG. 4 shows the terminal pin cover 15. The terminal pin cover 15 is formed from a resin, and it has an elongated shape, an opening 17 at a side, and a closed bottom surface at other side. Plural ribs 16a to 16e are formed on the inner surface of the opening 17 of the terminal pin cover 15, thereby forming plural openings 17a to 17f. By forming the ribs 16a to 16e, six spaces 25a to 25f, separated from each other and having openings 17a to 17f, are formed. In a condition in which the terminal pin cover 15 covers the terminal pins 12, each terminal pin 12 is contained in the openings 17a to 17f, that is, each terminal pin 12 is individually contained in the six spaces 25a to 25f.

Figure 5:
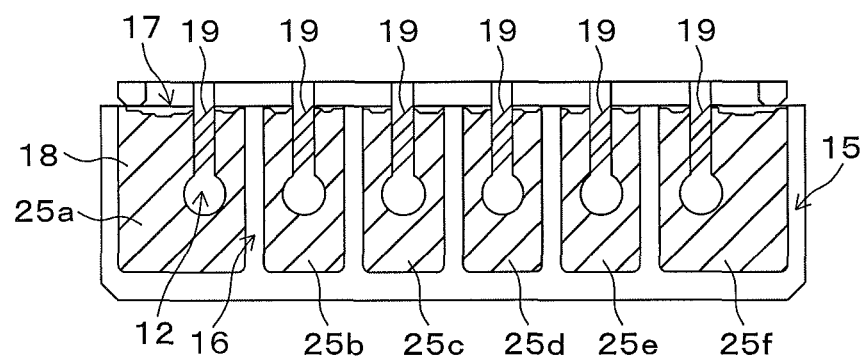
FIG. 5 is a drawing showing a condition in which a varnish is filled in the terminal pin cover shown in FIG. 4 and the terminal pins are dipped in the varnish.

FIG. 5 shows a condition in which after filling a varnish 18 made of a synthetic resin in the terminal pin cover 15, the terminal pin 12 is dipped into the varnish 18. In a condition in which the terminal pin cover 15 is attached to the wire outgoing portion 11 while covering the terminal pins 12, the interior of the openings 17a to 17f of the terminal pin cover 15, that is, the separated spaces 25a to 25f, are filled with the varnish 18. Therefore, each terminal pin 12 is dipped into the varnish 18, and the wound portion 19 (see FIG. 5) of the winding wire 14, which is welded to the terminal pin 12, is sealed in the varnish 18. That is, each wound portion 19 of the winding wire 14 individually exists in the spaces 25a to 25f, and is sealed by the varnish 18 so as not to contact external air. As a filler, materials other than varnish may be used, as long as the materials have electrical insulating characteristics, sealing efficiency, and durability. For example, materials such as silicone type materials and epoxy resin may be used as the filler.

A method for attaching the terminal pin cover 15 to the wire outgoing portion 11 will be explained hereinafter. First, the terminal pin cover 15 is positioned such that the opening 17 faces upward. Then, the varnish 18 formed of a synthetic resin is filled in the terminal pin cover 15. On the other hand, the end portion 14a of the winding wire 14 is wound around the terminal pin 12, and the end portion 14a is connected to the terminal pin 12 by TIG welding, thereby preparing the stator 3.

The stator 3 of which terminal pin 12 faces downward and the terminal pin cover 15 of which opening 17 faces upward are positioned, and then, the terminal pin cover 15 is approximated to the stator 3 from below, and the terminal pin cover 15 is attached to a portion of the terminal pins 12. In this case, the terminal pin 12 is inserted into each opening 17 (openings 17a to 17f), so that the terminal pin 12 and the welded wound portion 19 of the winding wire 14 are dipped into the varnish 18 (see FIG. 5).

Then, the stator 3 to which the terminal pin cover 15 was attached is placed into an oven, and the varnish 18 made of the synthetic resin is heated and solidified. The solidification of the varnish 18 holds and fixes the terminal pin cover 15 to the wire outgoing portion 11. The solidification of the varnish 18 fixes the sealing structure of the wound portion 19 of the winding wire 14.

As shown in FIG. 5, the opening 17 of the terminal pin cover 15 is separated by the ribs 16 (16a to 16e) into plural spaces 25a to 25f. According to the structure, each terminal pin 12 is disposed in the spaces 25a to 25f separated by the ribs 16, whereby the wound portion 19 that is welded to the terminal pin 12 is stably sealed in the varnish 18.

As shown in FIG. 4, since the terminal pin cover 15 is separated into the openings 17a to 17f by the ribs 16, when the varnish 18 is filled into each opening 17 (spaces 25a to 25f), as shown in FIG. 5, the circumferential varnish 18 contacting the inner surface of the opening 17 of the terminal pin cover 15 rises by the surface tension and the center portion of the varnish 18 sags. The center portion of the varnish 18 is slightly lower than the circumferential portion of the varnish 18, whereby the wound portion 19 of the winding wire 14, which is welded to the terminal pin 12, is stably sealed in the varnish 18. Therefore, corrosion of the copper wire of the wound portion 19 can be prevented even if the resolver is used in an environment having corrosive elements.

Figure 6:
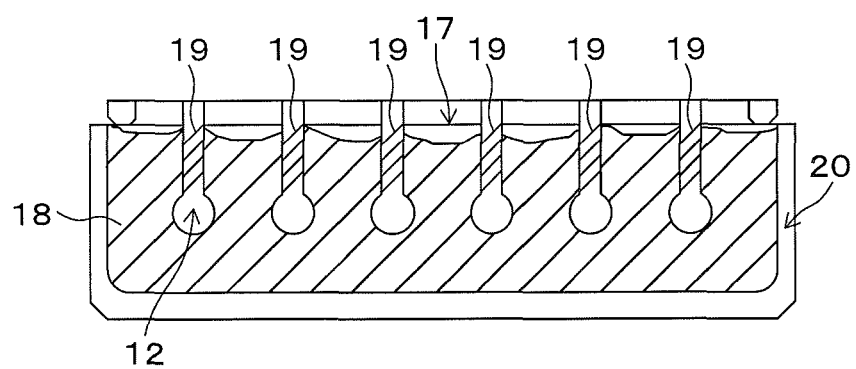
FIG. 6 is a drawing showing a conventional condition in which a varnish is filled in a terminal pin cover in which no rib is formed and terminal pins are dipped in the varnish.

FIG. 6 shows a conventional embodiment in which an opening of a terminal pin cover has no partition. That is, FIG. 6 shows a condition in which the opening 17 is not separated by the ribs 16, as shown in FIG. 5, and a terminal pin cover 20 having an opening 17 is used.

In the structure shown in FIG. 6, when the varnish 18 made of a synthetic resin is filled into the terminal pin cover 20, the circumferential varnish 18 contacting the inner surface of the opening 17 of the terminal pin cover 20 rises by the surface tension and the center portion of the varnish 18 sags. The center portion of the varnish 18 is lower than the circumferential portion of the varnish 18. Therefore, when the terminal pin 12 is dipped into the varnish 18, the wound portion 19 of the winding wire 14, which is welded to the terminal pin 12 and positioned at the center of the terminal pin cover 20, may not be stably sealed. Therefore, the exposed copper wire of the wound portion 19 may corrode when the resolver is used in an environment in which there are corrosive elements, and there is a concern that the wound portion 19 of the winding wire 14 may be broken.

As is apparent from the conventional embodiment in FIG. 6, the wound portion 19 of the winding wire 14 can be stably sealed by providing the ribs 16 and separating the space into small spaces 25a to 25f as shown in FIG. 5.

Figure 7A:
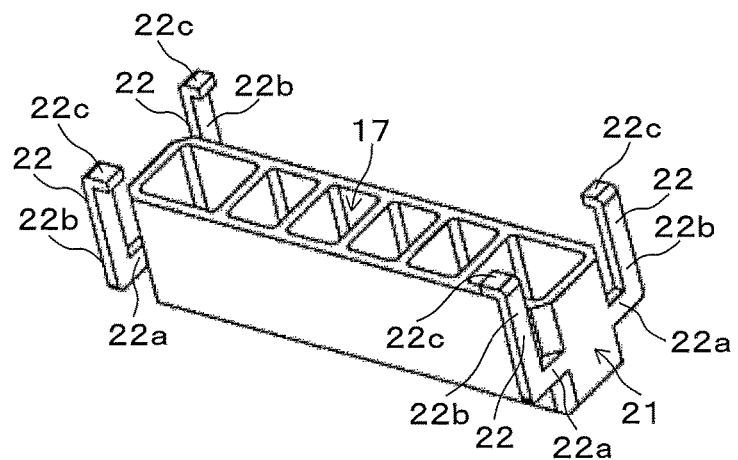
FIG. 7A is a perspective view of a terminal pin cover according to another embodiment.

FIG. 7A shows another embodiment of a terminal pin cover. The difference between the terminal pin cover 21 shown in FIG. 7A and the terminal pin cover 15 shown in FIG. 4 is that a hook portion 22, which is an engaging portion for engaging the wire outgoing portion 11, is integrally formed at both sides of the terminal pin cover 21 as shown in FIG. 7A.

Figure 8:
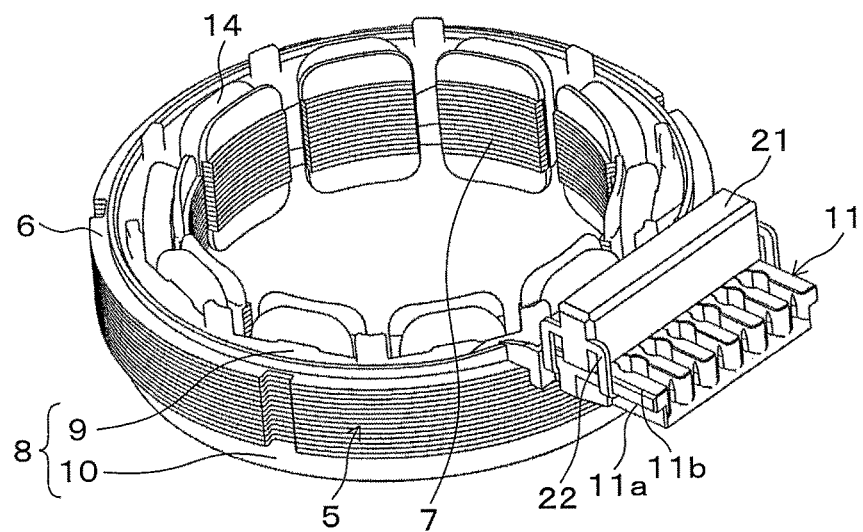
FIG. 8 is a drawing showing a condition in which the terminal pin cover shown in FIG. 7A is attached to a wire outgoing portion of the stator.

FIG. 8 shows a condition in which the terminal pin cover 21 shown in FIG. 7A is attached to the wire outgoing portion 11 of the stator 3. In the structure shown in FIG. 8, the hook portion 22 formed at both sides of the terminal pin cover 21 is engaged with a step portion 11a which is formed at both side edges of the wire outgoing portion 11, whereby the terminal pin cover 21 is attached to the wire outgoing portion 11. Thus, the terminal pin cover 21 is mechanically attached to the wire outgoing portion 11, the attaching structure can be strong, and operation of covering the terminal pins 12 with the terminal pin cover 21 is easy, thereby improving operation efficiency.

Figure 7B:
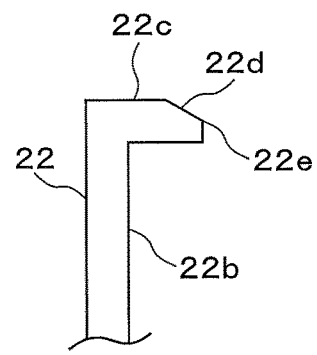
FIG. 7B is a side view of an arrangement of a hook.

Referring to FIG. 7A, the hook portion 22 is composed of arms 22a extending from the bottom portion of the terminal pin cover 21 toward both short directions thereof. A column 22b is extended in the axial direction from an end of each of arms 22a and a hook 22c is extended from an end of the column 22b in the longitudinal direction of the terminal pin cover 21 toward the opposite hook portion 22. FIG. 7B shows an arrangement of the hook 22c. As shown in FIG. 7B, the hook 22c has a sloping surface 22d with a downhill slope toward the opposite hook portion 22 in the longitudinal direction of the terminal pin cover 21. The hook 22 and the terminal pin cover 21 are made from an elastic material such as plastic. The distance between end edges 22e of the sloping surfaces 22d in the longitudinal direction is slightly shorter than the distance between the step portions 11a. In attaching the terminal pin cover 21 to the wire outgoing portion 11, the stator 3 of which terminal pin 12 faces downward and the terminal pin cover 21 of which opening 17 faces upward are positioned. Then, the terminal pin cover 21 is approximated to the stator 3 from below. In this condition, the sloping surfaces 22d of the hooks 22c contact the edge of the step portion 11a, then the hook portions 22 are elastically expanded by the step portion 11a. When the sloping surfaces 22d overreach the step portion 11a, the hook portions 22 elastically return and engage with the step portion 11a. In such an arrangement, the terminal pin cover 21 is attached to the wire outgoing portion 11 by simply pushing the terminal pin cover 21. Since the attaching is performed by one-touch operation, the operation efficiency can be further improved. In order to facilitate the above operation, the step portion 11a may be formed with a chamfer 11b at the corner thereof.

In the method for attaching the terminal pin cover 21 to the wire outgoing portion 11, steps other than the step in which the hook portion 22 formed at both sides of the terminal pin cover 21 is engaged with the wire outgoing portion 11, are the same as in the case of the terminal pin cover 15 shown in FIG. 4. Therefore, explanation of other steps is omitted. In the case in which the terminal pin cover 21 is used, as well as the case in which the terminal pin cover 15 shown in FIG. 4 is used, corrosion of the copper wire of the wound portion 19 can be prevented even if the resolver is used in an environment having corrosive elements.

In the embodiments explained above, the ribs 16a to 16e may have an opening, whereby the spaces 25a to 25f internally communicate. The embodiment of the present invention is not limited to each of the above embodiments and includes various modifications that may be anticipated by one skilled in the art. In addition, the effects of the present invention are also not limited to the description above. That is, various additions, changes, and partial deletions can be made in a range that does not exceed the general concept and object of the present invention, which are derived from the descriptions recited in the Claims and equivalents thereof.

What is claimed is:
1. A resolver comprising:
 a stator including a circular yoke, plural salient poles radially projecting inward from the yoke, and winding wires wound around the salient poles via an insulator;
 a rotor disposed inside the stator;

a wire outgoing portion arranged with plural terminal pins, the terminal pins being connected to end portions of the winding wires; and a terminal pin cover attached to the wire outgoing portion and covering the terminal pins;

wherein the terminal pin cover has a rectangular parallelepiped shape with only one side with an opening and includes plural spaces which individually contain the terminal pins respectively, and each space is filled with a filler, and wherein the only one side of the terminal pin cover is closed with the wire outgoing portion so that the terminal pin cover is entirely closed with no sides that are open and the end portions of the winding wires electrically connected to the terminal pins are sealed in the filler.

2. The resolver according to claim 1, wherein an engaging portion for engaging with the wire outgoing portion is integrally formed at both sides of the terminal pin cover.

3. The resolver according to claim 1, wherein the spaces are separated by ribs connecting inner opposite surfaces of the terminal pin cover.

4. The resolver according to claim 2, wherein the wire outgoing portion is provided with a step portion for engaging with the engaging portion.

5. The resolver according to claim 2, wherein the engaging portion is a hook portion having arms extending from the terminal pin cover, a column extending from an end of each of the arms along an axial direction of the rotor, and a hook extending from an end of the column along the direction in which the spaces are aligned toward an opposite hook portion.

6. The resolver according to claim 5, wherein the hook is formed with a sloping surface at a side opposite to the column with a downhill slope toward the opposite hook portion.

7. The resolver according to claim 1, wherein the terminal pins extend along an axial direction, and each end of the terminal pins faces a side of the terminal pin cover opposite the only one side.

* * * * *